United States Patent [19]

Swapp et al.

[11] Patent Number: 5,385,441
[45] Date of Patent: Jan. 31, 1995

[54] METHOD AND APPARATUS FOR PICKING AND PLACING AN ARTICLE

[75] Inventors: Mavin C. Swapp, Gilbert; Milo W. Frisbie, Mesa, both of Ariz.

[73] Assignee: Motorola, Inc., Schaumburg, Ill.

[21] Appl. No.: 155,878

[22] Filed: Nov. 23, 1993

[51] Int. Cl.⁶ ............................................. B66F 11/00
[52] U.S. Cl. ...................... 414/627; 414/786; 414/737; 901/40
[58] Field of Search ............... 414/627, 737, 752, 417, 414/786, 793, 797; 294/64.1; 901/40

[56] References Cited

U.S. PATENT DOCUMENTS

| | | | |
|---|---|---|---|
| 4,094,441 | 6/1978 | Warren | 414/752 X |
| 4,437,232 | 3/1984 | Araki et al. | 414/627 X |
| 4,438,559 | 3/1984 | Asai et al. | 29/740 |
| 4,515,507 | 5/1985 | Asai et al. | 414/226 |
| 4,657,470 | 4/1987 | Clarke et al. | 414/627 |
| 4,759,679 | 7/1988 | Müller | 414/627 X |
| 4,799,854 | 1/1989 | Niskala | 414/737 |
| 4,801,234 | 1/1989 | Cedrone | 414/752 X |
| 5,033,730 | 7/1991 | Davies et al. | 294/64.1 X |
| 5,061,145 | 10/1991 | Genis et al. | 414/737 X |
| 5,074,742 | 12/1991 | Aoyama | 901/40 X |
| 5,127,692 | 7/1992 | Yakou et al. | 901/40 X |
| 5,184,068 | 2/1993 | Twigg et al. | 324/158 F |

FOREIGN PATENT DOCUMENTS 3217672  11/1983  Germany ............................ 414/627

*Primary Examiner*—Michael S. Huppert
*Assistant Examiner*—James W. Keenan
*Attorney, Agent, or Firm*—Rennie William Dover

[57] ABSTRACT

The present invention includes a method for transporting articles (24), and a pick and place apparatus (10) for implementing the method. The apparatus includes a suction tube (12) coupled to a pickup cam (11) and a pin (22) coupled to a hold-down cam (18). The pickup cam (11) and the hold-down cam (18) share a common cam shaft (15). In addition, the suction tube (12) is coupled to a pressure reduction apparatus (16) which is enabled throughout the transport process. The cam shaft (15) is rotated in a first direction to couple the article (24) to a suction cup (14). The article (24) is transported to a desired location and released by reversing the direction of rotation of the cam shaft (15). The article (24) is released by the pin (22) pushing the article (24) away from the suction cup (14).

12 Claims, 3 Drawing Sheets

METHOD AND APPARATUS FOR PICKING AND PLACING AN ARTICLE

FIELD OF THE INVENTION

The present invention relates, in general, to a method and apparatus for picking and placing an article, and more particularly, to a method and apparatus using suction for picking and placing the article.

BACKGROUND OF THE INVENTION

A common tool for transporting articles such as, for example, packaged integrated devices is a pick and place apparatus. In this type of apparatus, the articles are picked from a holding area and transported to an area such as a test site, or a mounting location. Typically, a suction cup is used, wherein the article is coupled to the suction cup using suction. Once the article is transported to the desired location, the suction to the suction cup is removed, thereby de-coupling or releasing the article from the suction cup.

A drawback to this approach is that the number of articles transported per unit time is dependent on the amount of time required to create the suction in the lines coupled to the suction cup when picking up an article. A further drawback is the amount of time required to restore the air pressure to the lines coupled to the suction cup when releasing the article, i.e., to remove the suction from the lines. The sum of these times represents a significant amount of the total time for transporting articles.

Accordingly, it would be advantageous to have a method and apparatus for transporting articles using suction to couple the article to a suction cup that eliminates the time associated with creating and subsequently removing suction in the lines coupled to the suction cup.

DETAILED DESCRIPTION OF THE DRAWINGS

Figure 1:
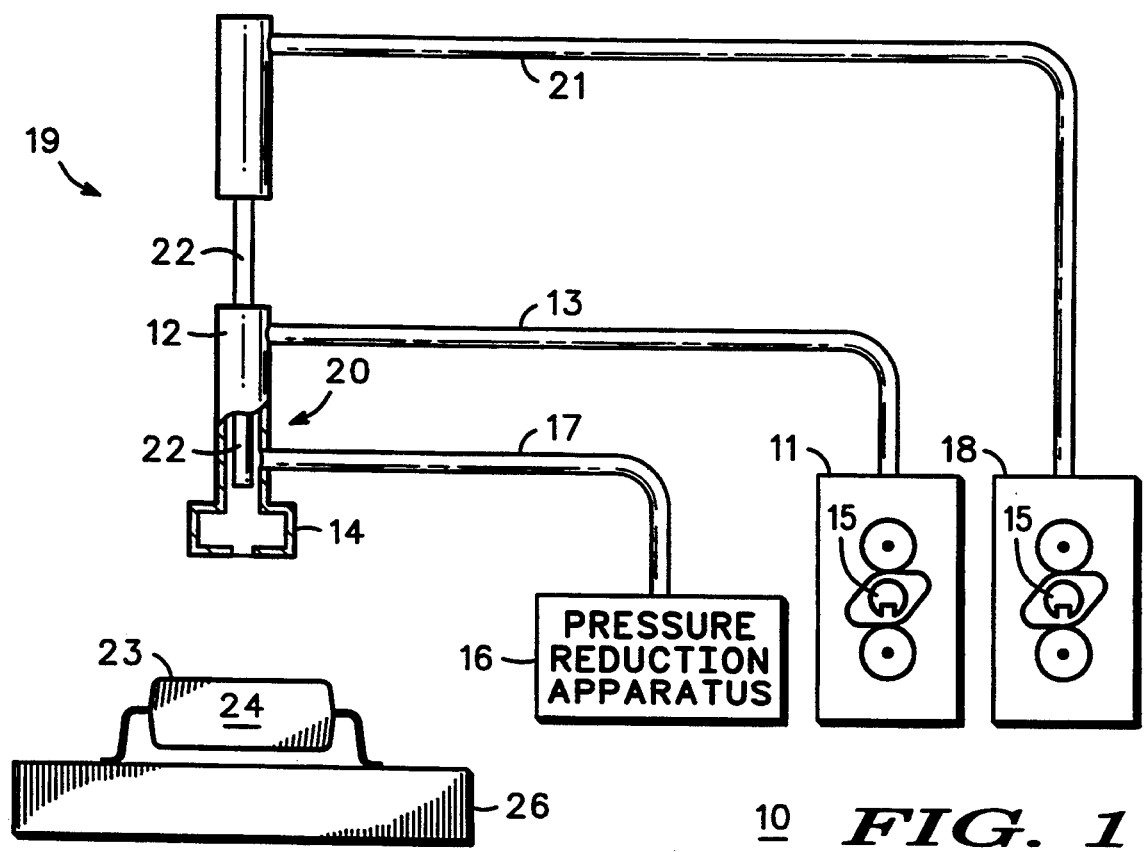
FIG. 1 illustrates a partially cut-away view of a pick and place apparatus in a first configuration and in accordance with an embodiment of the present invention.

The present invention provides a method and apparatus for transporting articles using continuous suction. In particular, the suction is applied to an article via a pickup device thereby coupling the article to the pickup device. The article is transported to a desired location and de-coupled from the pickup device using a mechanical means. The suction is maintained during both the coupling and de-coupling steps. It shall be understood that the same reference numerals are used in the figures to denote the same elements.

FIG. 1 illustrates a partially cut-away view of a pick and place apparatus 10 in a first configuration and in accordance with an embodiment of the present invention. The pick and place apparatus 10 includes a pickup cam 11 coupled to a suction tube 12 via a pickup slide 13. The suction tube 12, also referred to as a sleeve, includes a suction cup 14. A pressure reduction apparatus 16 is coupled to the suction tube 12 via a suction pipe 17. A hold-down cam 18 is coupled to a mechanical de-coupling device 19 via a hold-down slide 21. Although not shown, it shall be understood that the cams 11 and 18 share a common cam shaft 15. The mechanical de-coupling device 19 includes a pin 22 inserted in the suction tube 12. In other words, the suction tube 12 surrounds a portion of the pin 22. The combination of the suction tube 12 and the suction cup 14 is also referred to as a pickup device 20.

The initial steps in the method of the present invention include enabling the pressure reduction apparatus 16 and positioning the suction tube 12 and the pin 22 above a surface 23 of an article or workpiece 24. The particular article 24 is not a limitation of the present invention and may include, for example, packaged integrated devices, unpackaged integrated devices, printed circuit boards, molded plastic parts, etc. Further, the order of the initial steps is not a limitation of the present invention. For example, the suction tube 12 and the pin 22 may be positioned prior to enabling the pressure reduction apparatus 16. In the first configuration, the suction tube 12 and the pin 22 are in a retracted position. The suction tube 12 and the pin 22 are said to be in their home position when in the retracted position. In the first configuration, the suction tube 12 is sufficiently spaced apart from the article 24 that the suction generated by the pressure reduction apparatus 16 and present in the suction tube 12 is insufficient to couple the article 24 with the suction cup 14. The article 24 is shown as resting on a support structure 26.

Figure 2:
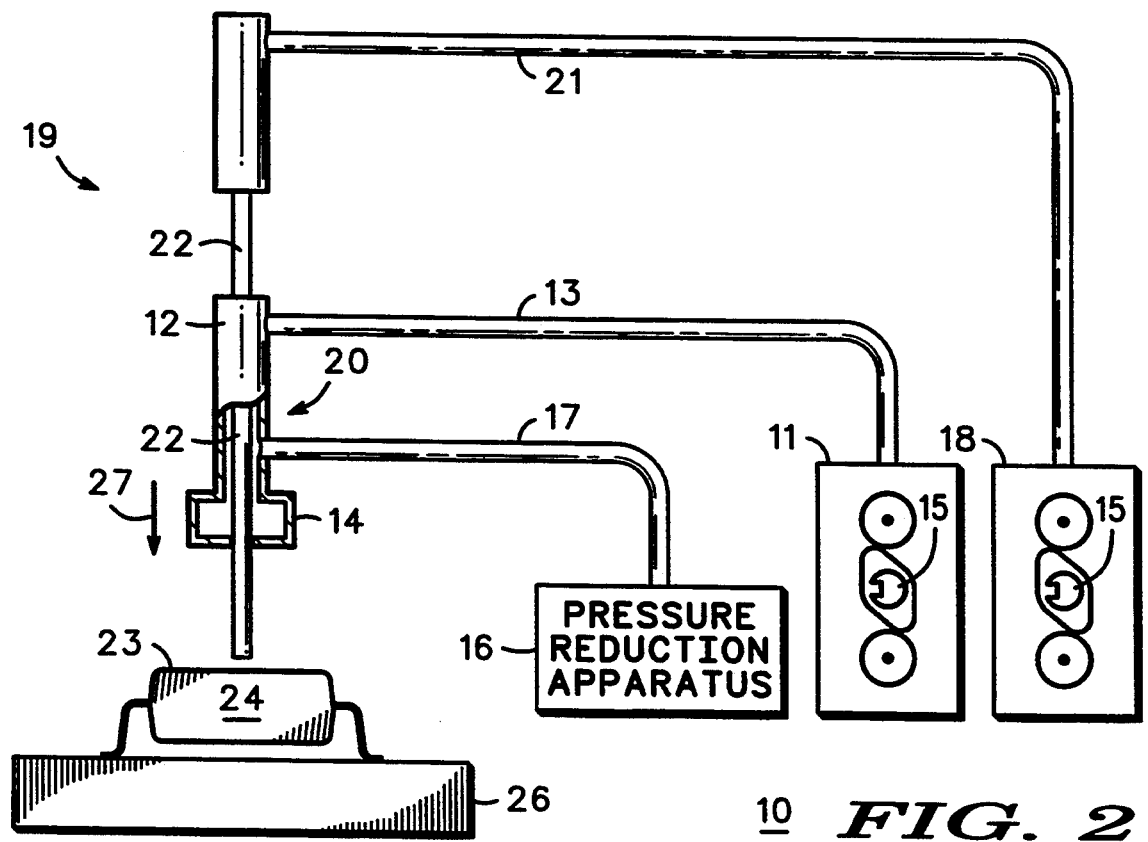
FIG. 2 illustrates a first embodiment of the pick and place apparatus of FIG. 1 in a second configuration.

FIG. 2 illustrates a partially cut-away view of the pick and place apparatus 10 in a second configuration, wherein the cam shaft 15 of the cams 11 and 18 are rotated in first direction (e.g., counter-clockwise) to extend the pin 22 in the direction indicated by the arrow 27. In the embodiment of FIG. 2, the pin 22 is extended to be adjacent to and spaced apart from the article 24.

Figure 3:
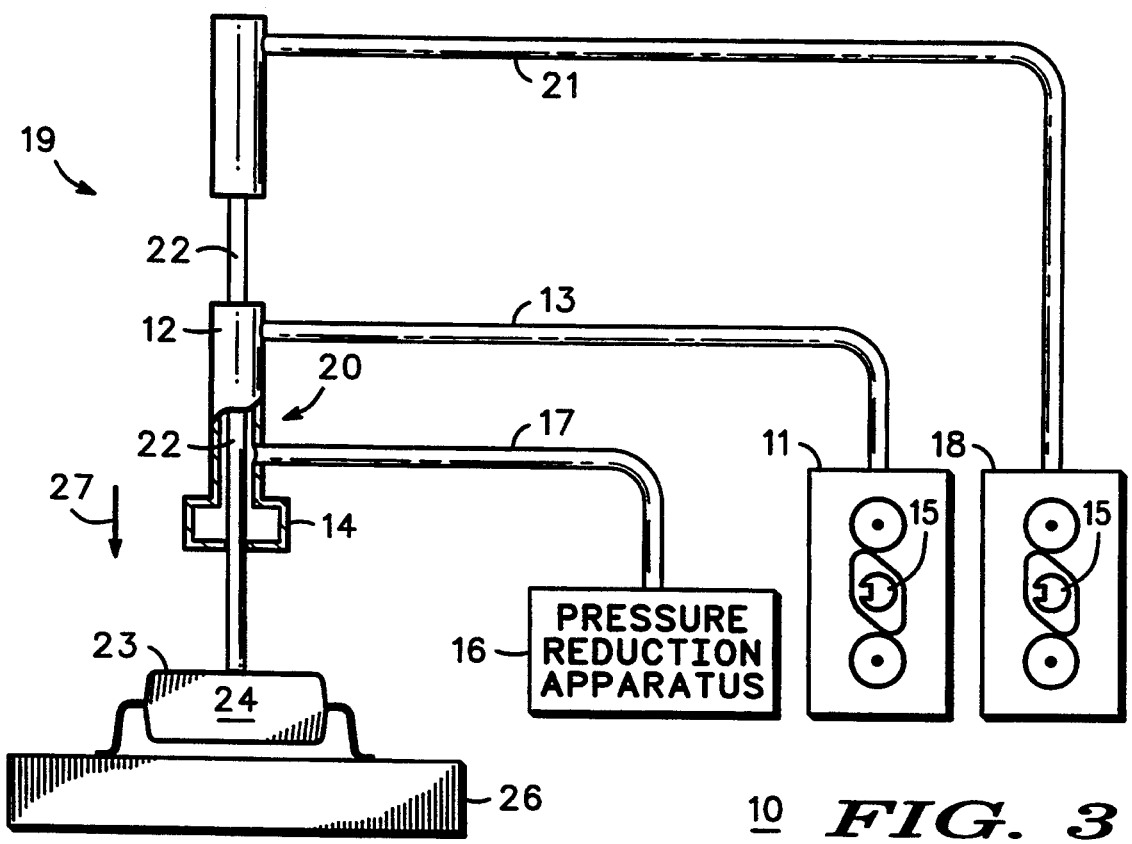
FIG. 3 illustrates a second embodiment of the pick and place apparatus of FIG. 1 in the second configuration.

FIG. 3 illustrates another embodiment of the pin 22 extended in the direction indicated by the arrow 27. In the embodiment shown in FIG. 3, the pin 22 contacts a surface of the article 24, thereby pinning the article to the support structure 26. In other words, the pin 22 pushes against a surface 23 of the article 24. In the embodiments shown in either FIG. 2 or FIG. 3, the pin 22 serves as a means for confining the article 24 in preparation for extending the suction tube 12.

Figure 4:
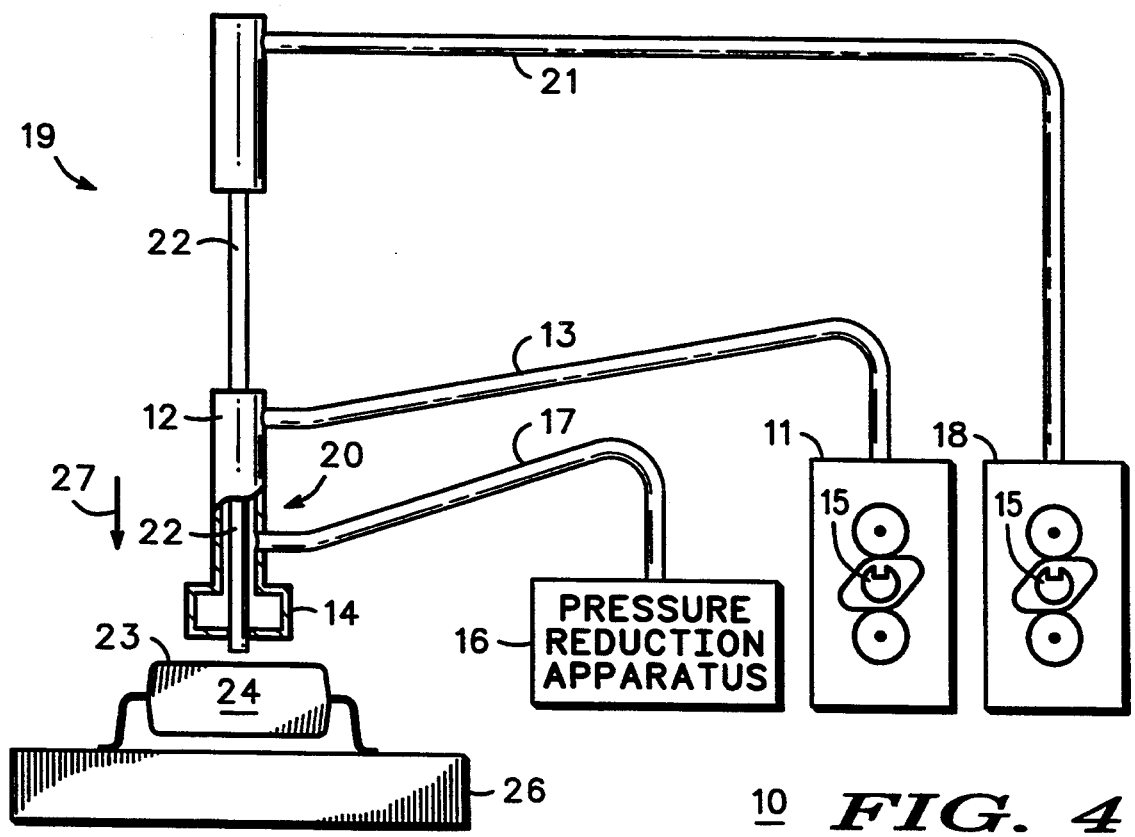
FIG. 4 illustrates the pick and place apparatus of FIG. 1 in a third configuration.

FIG. 4 illustrates a partially cut-away view of the pick and place apparatus 10 in a third configuration, wherein the cam shaft 15 of the cams 11 and 18 are rotated to extend the suction tube 12 in the direction indicated by the arrow 27. The pin 22 is shown as being in the same position as in the embodiment of FIG. 2, i.e., the pin 22 is extended to be adjacent to and spaced apart from the article 24. The pressure reduction apparatus 16 remains enabled as the suction tube 12 is extended towards the article 24. When the suction tube 12 becomes sufficiently close to the article 24, the air pressure between the suction cup 14 and the surface 23 of the article 24 is reduced such that the article 24 is pulled toward the suction cup 14. In other words, the article 24 is picked up with a suction cup using suction. The surface 23 of the article 24 contacts or is coupled to the suction cup 14. Thus, the surface 23 of the article 24 is coupled to the pickup device 20. The pin 22 ensures the article 24 correctly mates with the suction cup 14 as will be described presently.

It should be understood that in accordance with the embodiment of FIG. 3, the pin 22 may be pushing against the surface 23 when the suction tube 12 is extended in the direction indicated by the arrow 27.

Figure 5:
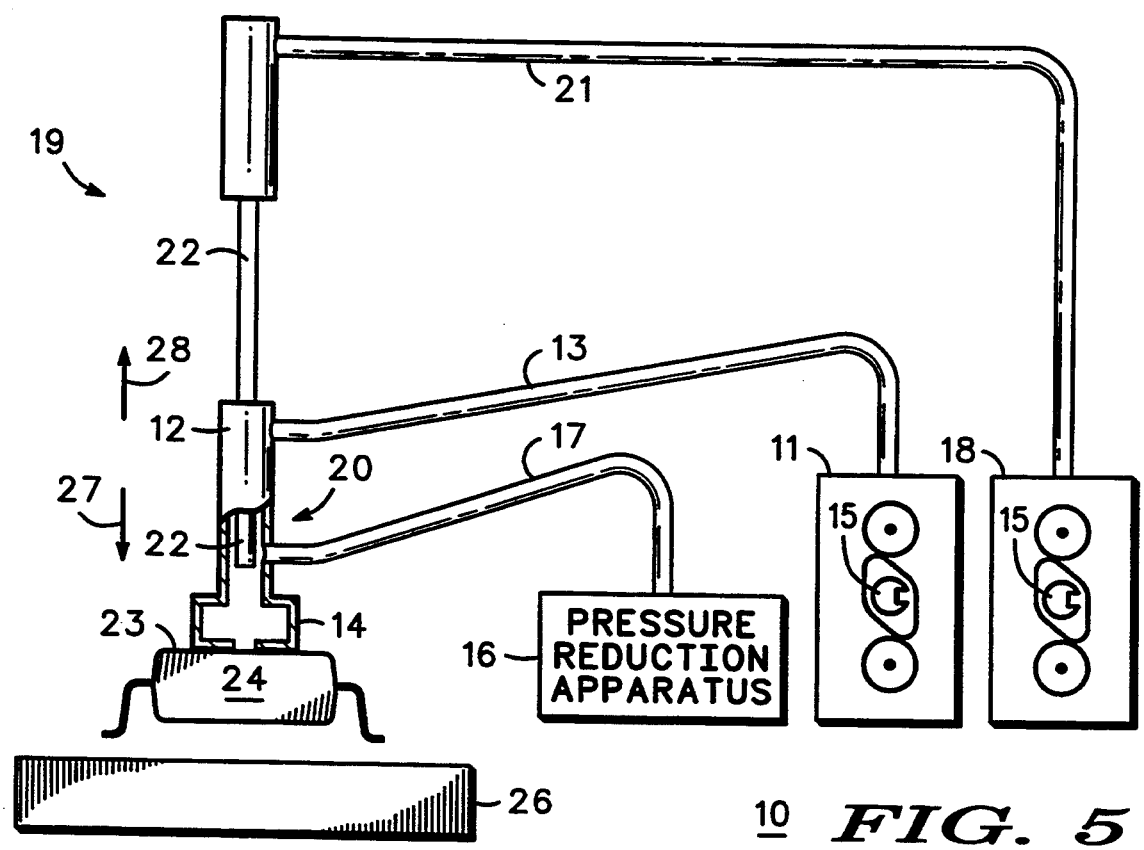
FIG. 5 illustrates the pick and place apparatus of FIG. 1 in a fourth configuration.

FIG. 5 illustrates a partially cut-away view of the pick and place apparatus 10 in a fourth configuration, wherein the cam shaft 15 of the cams 11 and 18 are rotated to move the pin 22 in the direction indicated by the arrow 28, i.e., to retract the pin 22. Upon retracting the pin 22, the suction created by the pressure reduction apparatus 16 couples the article 24 with the suction cup 14. In particular, the surface 23 mates with the suction cup 14.

Figure 6:
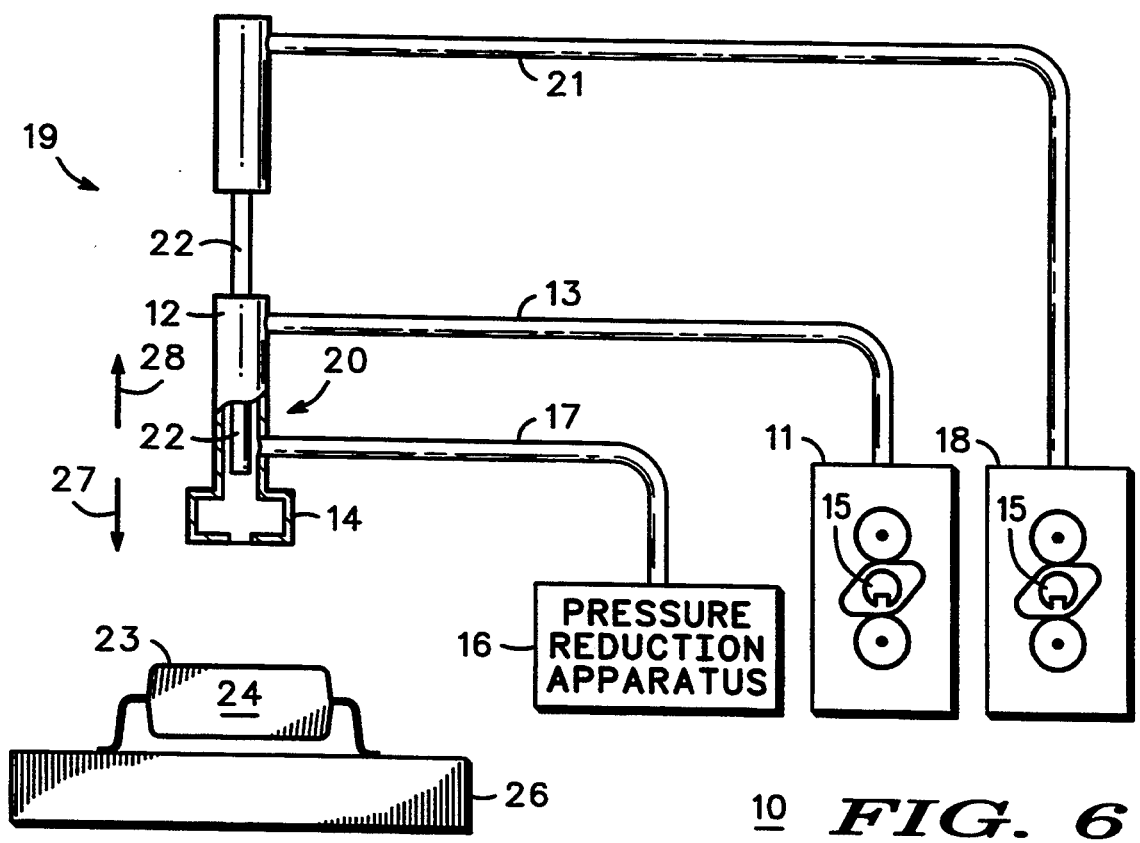
FIG. 6 illustrates the pick and place apparatus of FIG. 1 in a home position.

FIG. 6 illustrates a partially cut-away view of the pick and place apparatus 10 in their home position, i.e., the first configuration, wherein the cam shaft 15 of the cams 11 and 18 are rotated to move the suction tube 12 in the direction indicated by the arrow 28, i.e., to retract the suction tube 12.

Although not shown, the pick and place apparatus moves or positions the article 24 to a desired location. In other words, the pickup device 20 having the article 24 coupled thereto is selectively placed at a desired location. Methods of moving or placing an article mated with a suction cup or suction tube are well known to those skilled in the art.

The sequence for releasing or de-coupling the article 24 from the suction cup 14 is the reverse of that for coupling the article 24 to the suction cup 14. More particularly, the cam shaft 15 for the cams 11 and 18 is rotated in a second direction (e.g., clockwise) to move the suction tube 12 and the article 24 in the direction indicated by the arrow 27 of FIG. 5. The surface 23 is still mated with the suction cup 14 and the pin 22 remains in the retracted position. Initially, the suction tube 12 and the article 24 are positioned as illustrated in FIG. 5.

The cam shaft 15 of the cams 11 and 18 is further rotated in the second direction to extend the pin 22 in the direction of the arrow 27 of FIG. 5. The pin 22 is extended to be adjacent to and spaced apart from the article 24 as illustrated in FIG. 4. The pressure reduction apparatus 16 remains enabled as the pin 22 is extended towards the article 24.

The article 24 is released or de-coupled from the suction cup 14 by continuing to rotate the cam shaft 15 in the second direction, thereby retracting the suction tube 12. The surface 23 contacts the pin 22 as the suction tube 12 is retracted and prevents the article 24 from being raised any further. When the suction tube 12 becomes sufficiently spaced apart from the article 24, the suction from the pressure reduction apparatus 16 is no longer sufficient to hold the article 24. Accordingly, the article 24 becomes de-coupled from the pick and place apparatus 10 and remains at the desired location.

In another embodiment, the article 24 is de-coupled from the pickup device 20 by the pin 22 pushing against the surface 23 of the article 24 in the direction indicated by the arrow 27 until the suction tube 12 becomes sufficiently spaced apart from the article 24 such that suction from the pressure reduction apparatus 16 is insufficient to keep the article 24 coupled to the pickup device 20. Thus, the pin 22 serves as a mechanical means to apply a force against the article 24 while the suction is maintained.

After the article 24 is de-coupled from the pick and place apparatus 10, the cam 15 continues to rotate in the second direction thereby retracting the pin 22 and positioning the suction tube 12 and the pin 22 in their home position.

By now it should be appreciated that there has been provided a method and apparatus for transporting articles, such as packaged integrated devices, having reduced cycle times. More particularly, the method and apparatus permit transporting the articles while maintaining suction thereby eliminating the time required to generate the suction when coupling the articles to the suction tube as well as eliminating the time for removing the suction when de-coupling the articles to the suction tube.

While specific embodiments of the present invention have been shown and described, further modifications and improvements will occur to those skilled in the art. It is desired that it be understood, therefore, that this invention is not limited to the particular form shown and it is intended in the appended claims to cover all modifications which do not depart from the spirit and scope of this invention.

We claim:

1. A method of transporting a workpiece, comprising the steps of:
    providing a pick and place apparatus comprising a cam coupled to a pickup device, the pickup device comprising a suction tube having a suction cup at one end and surrounding a portion of a pin;
    placing the pin adjacent the workpiece;
    placing the suction cup adjacent the workpiece;
    picking up the workpiece using suction;
    positioning the workpiece at a desired location; and
    releasing the workpiece using the pin while maintaining the suction.

2. The method of claim 1, wherein the step of releasing the workpiece comprises pushing the pin against the workpiece.

3. The method of claim 1, wherein the step of placing the pin adjacent the workpiece comprises positioning the pin to be spaced apart from the workpiece.

4. The method of claim 1, wherein the step of placing the pin adjacent the workpiece comprises positioning the pin to be in contact with the workpiece.

5. A method of picking and placing an article, comprising the steps of:
    positioning a pin adjacent a surface of the article;
    positioning a suction tube adjacent the surface of the article, wherein the suction tube surrounds the pin and the step of positioning a suction tube further comprises:
    applying suction to the article, wherein the article becomes coupled to a pickup device;
    selectively placing the pickup device having the article coupled thereto; and
    maintaining the suction while simultaneously de-coupling the article from the pickup device.

6. The method of claim 5 wherein the step of de-coupling includes pushing the pin against the surface of the article.

7. The method of claim 5, wherein the step of applying suction to the article reduces a pressure of air adjacent the surface to couple the article to the pickup device.

8. The method of claim 5, wherein the step of de-coupling includes pushing the pin against the surface of the article, wherein the pin pushes the article away from the pickup device.

9. A pick and place apparatus, comprising:
a pressure reduction apparatus;
a pickup cam;
a pickup device coupled to the pickup cam by a slide tube and to the pressure reduction apparatus by a suction pipe, the pickup device comprising a suction tube coupled to a suction cup;
a mechanical de-coupling device for de-coupling an article from the pickup device while the pressure reduction apparatus is enabled, the mechanical de-coupling device inserted in the suction tube; and
a hold-down cam coupled to the mechanical de-coupling device by a hold-down slide, wherein the hold-down cam and the pickup cam share a common cam shaft.

10. The pick and place apparatus of claim 9, wherein the mechanical de-coupling device comprises a pin.

11. The pick and place apparatus of claim 9 further including a support structure for supporting an article.

12. The pick and place apparatus of claim 11, wherein the article comprises a packaged integrated device.

* * * * *